United States Patent
Asano

(10) Patent No.: US 12,323,138 B2
(45) Date of Patent: Jun. 3, 2025

(54) ANALOG SWITCH CIRCUIT AND SEMICONDUCTOR DEVICE

(71) Applicant: ROHM Co., LTD., Kyoto (JP)

(72) Inventor: Hayato Asano, Kyoto (JP)

(73) Assignee: ROHM Co., LTD., Kyoto (JP)

(*) Notice: Subject to any disclaimer, the term of this patent is extended or adjusted under 35 U.S.C. 154(b) by 86 days.

(21) Appl. No.: 18/466,181

(22) Filed: Sep. 13, 2023

(65) Prior Publication Data

US 2024/0097678 A1    Mar. 21, 2024

(30) Foreign Application Priority Data

Sep. 15, 2022  (JP) .................................. 2022-147384

(51) Int. Cl.
| H03K 17/687 | (2006.01) |
| H03K 17/06 | (2006.01) |
| H03K 17/22 | (2006.01) |

(52) U.S. Cl.
CPC ....... *H03K 17/6872* (2013.01); *H03K 17/063* (2013.01); *H03K 17/223* (2013.01)

(58) Field of Classification Search
CPC ................................................. H03K 17/6872
USPC ........................................................ 327/437
See application file for complete search history.

(56) References Cited

U.S. PATENT DOCUMENTS

| 8,896,363 B2* | 11/2014 | Chen ..................... H03K 17/687 |
| | | 327/437 |
| 2014/0084988 A1* | 3/2014 | Mishra .............. H03K 17/04123 |
| | | 327/437 |
| 2015/0171861 A1* | 6/2015 | Aherne .............. H03K 17/6872 |
| | | 327/437 |
| 2016/0056816 A1* | 2/2016 | Otani ................... H03K 17/687 |
| | | 327/437 |

FOREIGN PATENT DOCUMENTS

JP          6727016         7/2020

* cited by examiner

*Primary Examiner* — Tomi Skibinski
(74) *Attorney, Agent, or Firm* — CHIP LAW GROUP

(57) ABSTRACT

Provided is an analog switch circuit including an intermediate node, a first PMOS transistor including a source connected to the input node and a back gate and a drain connected to the intermediate node, a second PMOS transistor including a source connected to the output node, a back gate and a drain connected to the intermediate node, and a gate connected to a gate of the first PMOS transistor, a first NMOS transistor including a source grounded and a drain connected to the gates of the first PMOS transistor and the second PMOS transistor, a third PMOS transistor connected between the intermediate node and the drain of the first NMOS transistor, a first resistor connected between the gate of the first NMOS transistor and a ground, and a driver including an input that receives the control signal and an output connected to the gate of the first NMOS transistor.

8 Claims, 5 Drawing Sheets

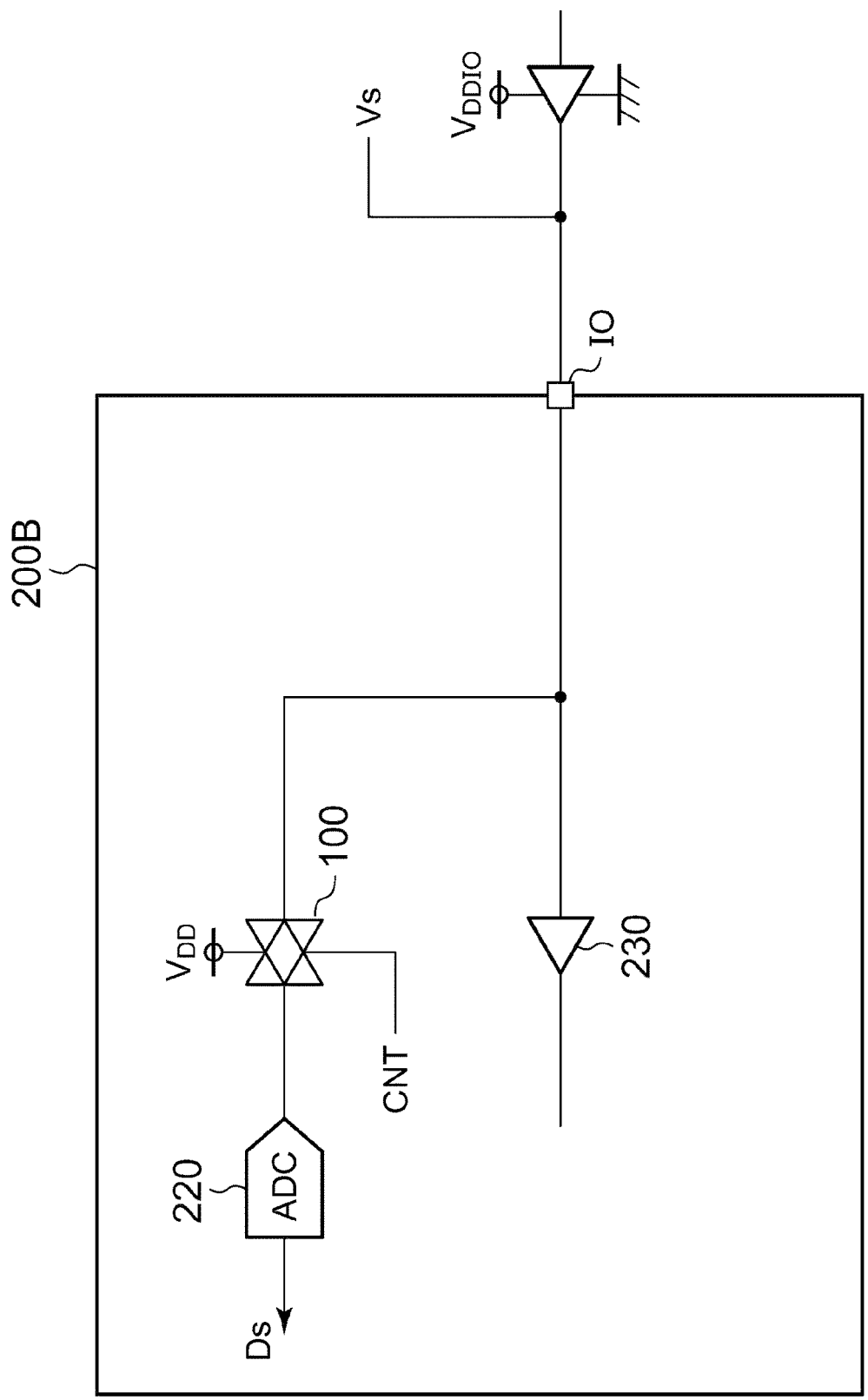
F I G . 5

ANALOG SWITCH CIRCUIT AND SEMICONDUCTOR DEVICE

CROSS REFERENCE TO RELATED APPLICATIONS

This application claims priority benefit of Japanese Patent Application No. JP 2022-147384 filed in the Japan Patent Office on Sep. 15, 2022. Each of the above-referenced applications is hereby incorporated herein by reference in its entirety.

BACKGROUND

The present disclosure relates to an analog switch circuit.

An analog switch for switching to transmission or cutting off of an analog signal is used in an electronic circuit that handles the analog signal. The analog switch is also called a complementary metal oxide semiconductor (CMOS) switch or a transfer gate.

FIG. 1 depicts a basic configuration of an analog switch 10. The analog switch 10 includes an N-channel MOS (NMOS) transistor 12 and a P-channel MOS (PMOS) transistor 14 connected in parallel. When a control signal CNT is high, a power supply voltage $V_{DD}$ is applied to a gate of the NMOS transistor 12, and a ground voltage $V_{SS}$ is applied to a gate of the PMOS transistor 14. The analog switch 10 is then turned on. On the other hand, when the control signal CNT is low, the ground voltage $V_{SS}$ is applied to the gate of the NMOS transistor 12, and the power supply voltage $V_{DD}$ is applied to the gate of the PMOS transistor 14. The analog switch 10 is then turned off.

An example of the related art is disclosed in Japanese Patent No. 6727016.

BRIEF DESCRIPTION OF THE DRAWINGS

FIG. 5 is a block diagram of a semiconductor device including the analog switch circuit.

DETAILED DESCRIPTION

Overview of Embodiments

Figure 1:
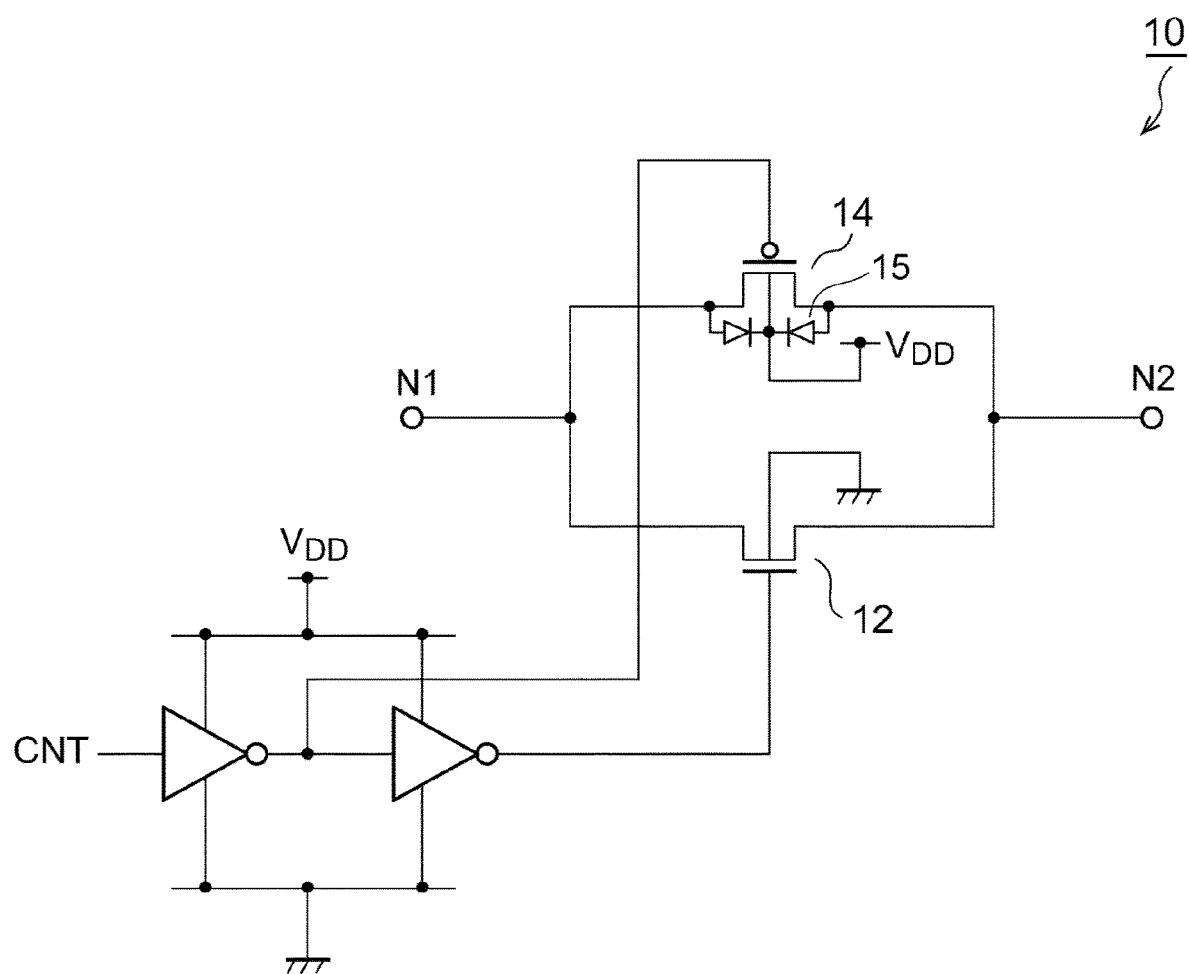
FIG. 1 depicts a basic configuration of an analog switch.

An overview of some exemplary embodiments of the present disclosure will be described. The overview simply describes some concepts of one or a plurality of embodiments for basic understanding of the embodiments as a preface to detailed explanation described later, and the overview does not limit the extent of the technology or the disclosure. The overview is not a comprehensive overview of all conceivable embodiments, and the overview is not intended to specify important elements of all the embodiments or to define the scope of part or all of the aspects. For convenience, "one embodiment" may be used to represent one embodiment (example or modification) or a plurality of embodiments (examples or modifications) disclosed in the present specification.

An embodiment provides an analog switch circuit that can electrically connect and disconnect an input node and an output node according to a control signal. The analog switch circuit includes an intermediate node; a first PMOS transistor including a source connected to the input node and a back gate and a drain that are connected to the intermediate node; a second PMOS transistor including a source connected to the output node, a back gate and a drain that are connected to the intermediate node, and a gate connected to a gate of the first PMOS transistor; a first NMOS transistor including a source grounded and a drain connected to the gates of the first PMOS transistor and the second PMOS transistor; a third PMOS transistor connected between the intermediate node and the drain of the first NMOS transistor, the third PMOS transistor including a gate connected to a gate of the first NMOS transistor; a first resistor connected between the gate of the first NMOS transistor and a ground; and a driver including an input that receives the control signal and an output connected to the gate of the first NMOS transistor.

According to the configuration, a flow of a reverse current through the back gate of the PMOS transistor can be prevented when the analog switch circuit is electrically disconnected (OFF). The third PMOS transistor is turned off when the analog switch circuit is electrically connected (ON), and the intermediate node and the ground are thus cut off. This can reduce the influence of the signal passing through the first PMOS transistor and the second PMOS transistor on the voltage level.

In an embodiment, the analog switch circuit may further include a second resistor connected between the intermediate node and the drain of the first NMOS transistor, in series with the third PMOS transistor.

In an embodiment, the analog switch circuit may further include a second NMOS transistor connected between the input node and the output node, in parallel to a series connection circuit of the first PMOS transistor and the second PMOS transistor, the second NMOS transistor including a back gate grounded and a gate connected to the output of the driver.

In an embodiment, the analog switch circuit may be integrated into one semiconductor substrate. The "integration" includes a case in which all of the constituent elements of the circuit are formed on the semiconductor substrate and a case in which main constituent elements of the circuit are integrated. Some of the resistors and capacitors for adjusting the circuit constants, for example, may be provided outside the semiconductor substrate. With the circuit integrated on one chip, the circuit area can be reduced, and the characteristics of the circuit elements can be kept uniform.

An embodiment provides a semiconductor device including an input/output pin and any one of the above-mentioned analog switch circuits including an input node connected to the input/output pin.

In an embodiment, the semiconductor device may further include an analog-to-digital (A/D) converter connected to an output node of the analog switch circuit.

In an embodiment, the semiconductor device may further include an open drain circuit connected to the input/output pin.

In an embodiment, the semiconductor device may further include an input buffer that receives a digital signal input from outside to the input/output pin.

Embodiment

A preferred embodiment will now be described with reference to the drawings. The same reference signs are provided to the same or equivalent constituent elements, members, and processes illustrated in the drawings, and duplicate description will appropriately be omitted. Further, the embodiment is exemplary, not intended to limit the disclosure or the technology. All features and combinations of the features described in the embodiment may not be essential for the disclosure and the technology.

In the present specification, "a state in which a member A is connected to a member B" includes a case in which the member A and the member B are physically and directly connected to each other, as well as a case in which the member A and the member B are indirectly connected to each other through another member that does not substantially affect their electrical connection state or that does not impair the functions and the effects obtained by coupling them.

Similarly, "a state in which a member C is connected (provided) between a member A and a member B" includes a case in which the member A and the member C or the member B and the member C are directly connected to each other, as well as a case in which they are indirectly connected to each other through another member that does not substantially affect their electrical connection state or that does not impair the functions and the effects obtained by coupling them.

Moreover, in the present specification, reference signs provided to electrical signals such as voltage signals and current signals, as well as circuit elements such as resistors, capacitors, and inductors, represent their voltage values, current values, or circuit constants (resistance values, capacitance values, or inductances) as necessary.

Figure 2:
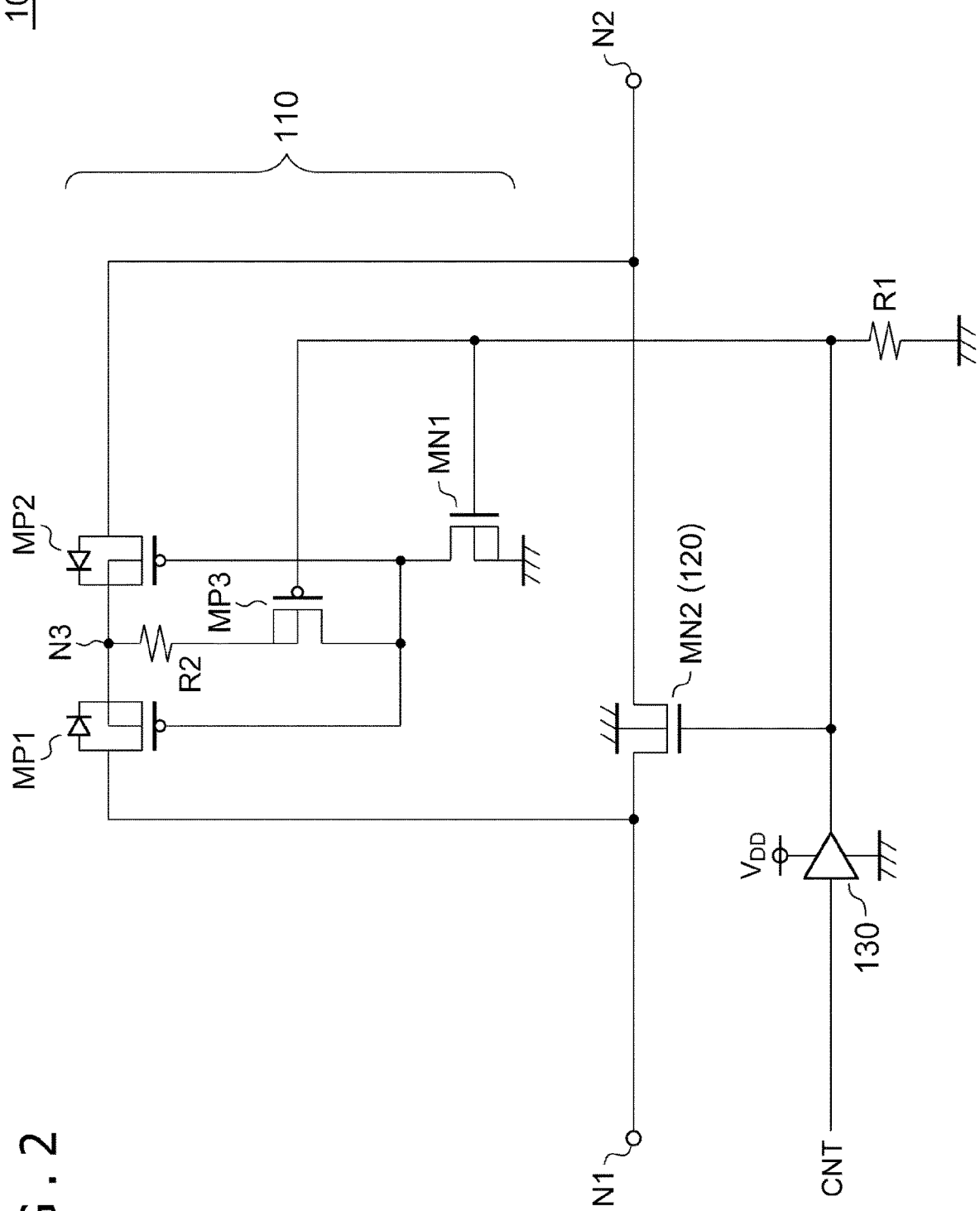
FIG. 2 is a circuit diagram of an analog switch circuit according to an embodiment.

FIG. 2 is a circuit diagram of an analog switch circuit 100 according to the embodiment. The analog switch circuit 100 includes an input node N1 and an output node N2. The analog switch circuit 100 can switch between a state in which the input node N1 and the output node N2 are electrically connected to each other (ON state) and a state in which the input node N1 and the output node N2 are electrically disconnected from each other (OFF state), according to a control signal CNT.

The analog switch circuit 100 includes a two-way PMOS switch 110, an NMOS switch 120, a driver 130, and a first resistor R1.

The two-way PMOS switch 110 includes a first PMOS transistor MP1, a second PMOS transistor MP2, a third PMOS transistor MP3, a first NMOS transistor MN1, and a second resistor R2.

The first PMOS transistor MP1 and the second PMOS transistor MP2 are connected in series between the input node N1 and the output node N2. A connection node of the first PMOS transistor MP1 and the second PMOS transistor MP2 will be referred to as an intermediate node N3.

A source of the first PMOS transistor MP1 is connected to the input node N1, and a back gate and a drain of the first PMOS transistor MP1 are connected to the intermediate node N3.

A source of the second PMOS transistor MP2 is connected to the output node N2, and a back gate and a drain of the second PMOS transistor MP2 are connected to the intermediate node N3. A gate of the second PMOS transistor MP2 is connected to a gate of the first PMOS transistor MP1.

A source of the first NMOS transistor MN1 is grounded, and a drain of the first NMOS transistor MN1 is connected to the gates of the first PMOS transistor MP1 and the second PMOS transistor MP2.

The third PMOS transistor MP3 is connected between the intermediate node N3 and the drain of the first NMOS transistor MN1. A gate of the third PMOS transistor MP3 is connected to a gate of the first NMOS transistor MN1.

The first resistor R1 is connected between the gate of the first NMOS transistor MN1 and the ground.

The NMOS switch 120 includes a second NMOS transistor MN2 connected between the input node N1 and the output node N2. A back gate of the second NMOS transistor MN2 is grounded.

The control signal CNT is input to an input of the driver 130, and an output of the driver 130 is connected to the gates of the first NMOS transistor MN1, the third PMOS transistor MP3, and the second NMOS transistor MN2. A power supply voltage $V_{DD}$ is supplied to a power line of the driver 130. The driver 130 outputs the power supply voltage $V_{DD}$ when the control signal CNT is high, and outputs a ground voltage 0 V when the control signal CNT is low.

This completes the description of the configuration of the analog switch circuit 100. Next, an operation of the analog switch circuit 100 will be described.

ON State

The power supply voltage $V_{DD}$ is applied to the gate of the second NMOS transistor MN2 when the control signal CNT becomes high. As a result, signals can pass through the second NMOS transistor MN2.

The power supply voltage $V_{DD}$ is also applied to the gate of the first NMOS transistor MN1, and the first NMOS transistor MN1 is turned on. As a result, the voltage of the gates of the first PMOS transistor MP1 and the second PMOS transistor MP2 becomes 0 V, and signals can pass through the first PMOS transistor MP1 and the second PMOS transistor MP2.

OFF State

0 V is applied to the gate of the second NMOS transistor MN2 when the control signal CNT becomes low. As a result, the second NMOS transistor MN2 is electrically disconnected.

0 V is applied to the gate of the third PMOS transistor MP3 when the control signal CNT becomes low, and the third PMOS transistor MP3 enters the ON state. As a result, the gate and the source of the first PMOS transistor MP1 are connected to each other, and the gate and the source of the second PMOS transistor MP2 are connected to each other. Therefore, the first PMOS transistor MP1 and the second PMOS transistor MP2 are electrically disconnected from each other.

In this case, the first NMOS transistor MN1 is turned off.

This completes the description of the operation of the analog switch circuit 100.

In the analog switch circuit 100, the back gates of the first PMOS transistor MP1 and the second PMOS transistor MP2 are not connected to the power line. This can prevent a reverse current from flowing toward the power line when a voltage higher than the power supply voltage $V_{DD}$ is applied to the input node N1 or the output node N2.

Additional benefits of the analog switch circuit 100 will become apparent by comparison with a comparative technique.

Figure 3:
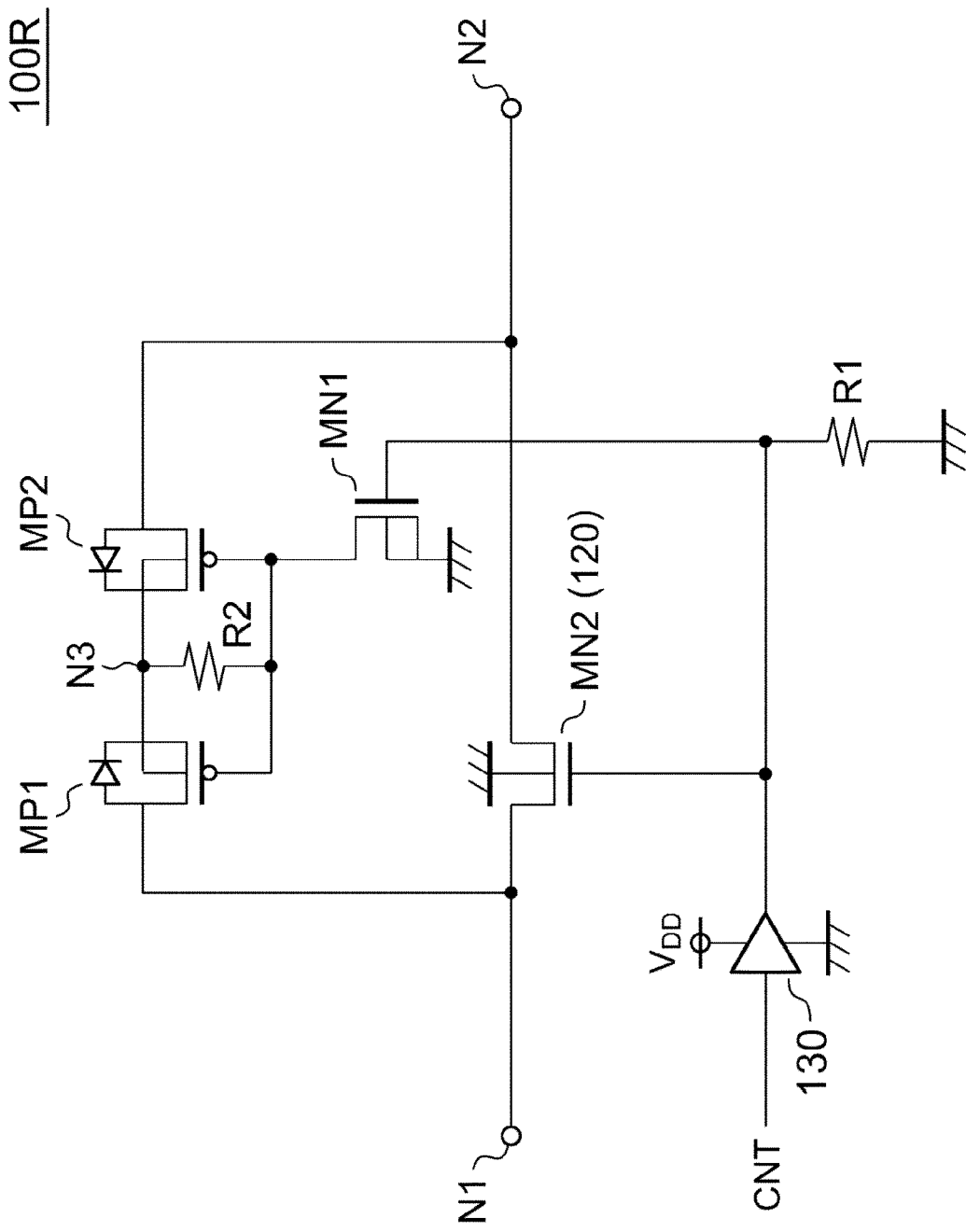
FIG. 3 is a circuit diagram of an analog switch circuit according to a comparative technique.

FIG. 3 is a circuit diagram of an analog switch circuit 100R according to the comparative technique. The analog switch circuit 100R does not include the third PMOS transistor MP3, and the second resistor R2 is directly connected between the intermediate node N3 and the drain of the first NMOS transistor MN1.

An operation of the analog switch circuit 100R according to the comparative technique of FIG. 3 will be described.

ON State

The power supply voltage $V_{DD}$ is applied to the gate of the second NMOS transistor MN2 when the control signal CNT becomes high. As a result, signals can pass through the second NMOS transistor MN2. This is similar to the embodiment.

The power supply voltage $V_{DD}$ is also applied to the gate of the first NMOS transistor MN1, and the first NMOS transistor MN1 is turned on. As a result, the voltage of the gates of the first PMOS transistor MP1 and the second PMOS transistor MP2 becomes 0 V, and signals can pass through the first PMOS transistor MP1 and the second PMOS transistor MP2.

OFF State

0 V is applied to the gate of the second NMOS transistor MN2 when the control signal CNT becomes low. As a result, the second NMOS transistor MN2 is electrically disconnected.

The first NMOS transistor MN1 is turned off when the control signal CNT becomes low. In this case, the gate and the source of the first PMOS transistor MP1 and the gate and the source of the second PMOS transistor MP2 are connected to each other through the resistor R2, and the first PMOS transistor MP1 and the second PMOS transistor MP2 enter the OFF state.

The back gates of the first PMOS transistor MP1 and the second PMOS transistor MP2 are also not connected to the power line in the analog switch circuit 100R according to the comparative technique. This can prevent the reverse current from flowing toward the power line when a voltage higher than the power supply voltage $V_{DD}$ is applied to the input node N1 or the output node N2.

However, the analog switch circuit 100R according to the comparative technique has the following problem.

The first NMOS transistor MN1 is turned on when the analog switch circuit 100R is in the ON state, and the intermediate node N3 and the ground are connected to each other through the second resistor R2. The second resistor R2 acts as a shunt resistance in the signal path including the first PMOS transistor MP1 and the second PMOS transistor MP2. The shunt resistance may possibly change the signal level or distort the waveform of the signal propagated through the signal path.

On the other hand, the problem of the comparative technique is solved in the analog switch circuit 100 according to the embodiment. As illustrated in FIG. 2, the third PMOS transistor MP3 is turned off in the ON state, and the second resistor R2 does not act as a shunt resistance in the signal path. This can suppress the change in signal level or the distortion of waveform.

Modifications of the analog switch circuit 100 will be described.

First Modification

The positions of the second resistor R2 and the third PMOS transistor MP3 may be switched.

Second Modification

The second resistor R2 may not be included.

Third Modification

Although the CMOS switch is described in the embodiment, the second NMOS transistor MN2 (NMOS switch 120) may not be included when the range of the signal level passing through the switch is narrow.

Next, the usage of the analog switch circuit 100 will be described.

Figure 4:
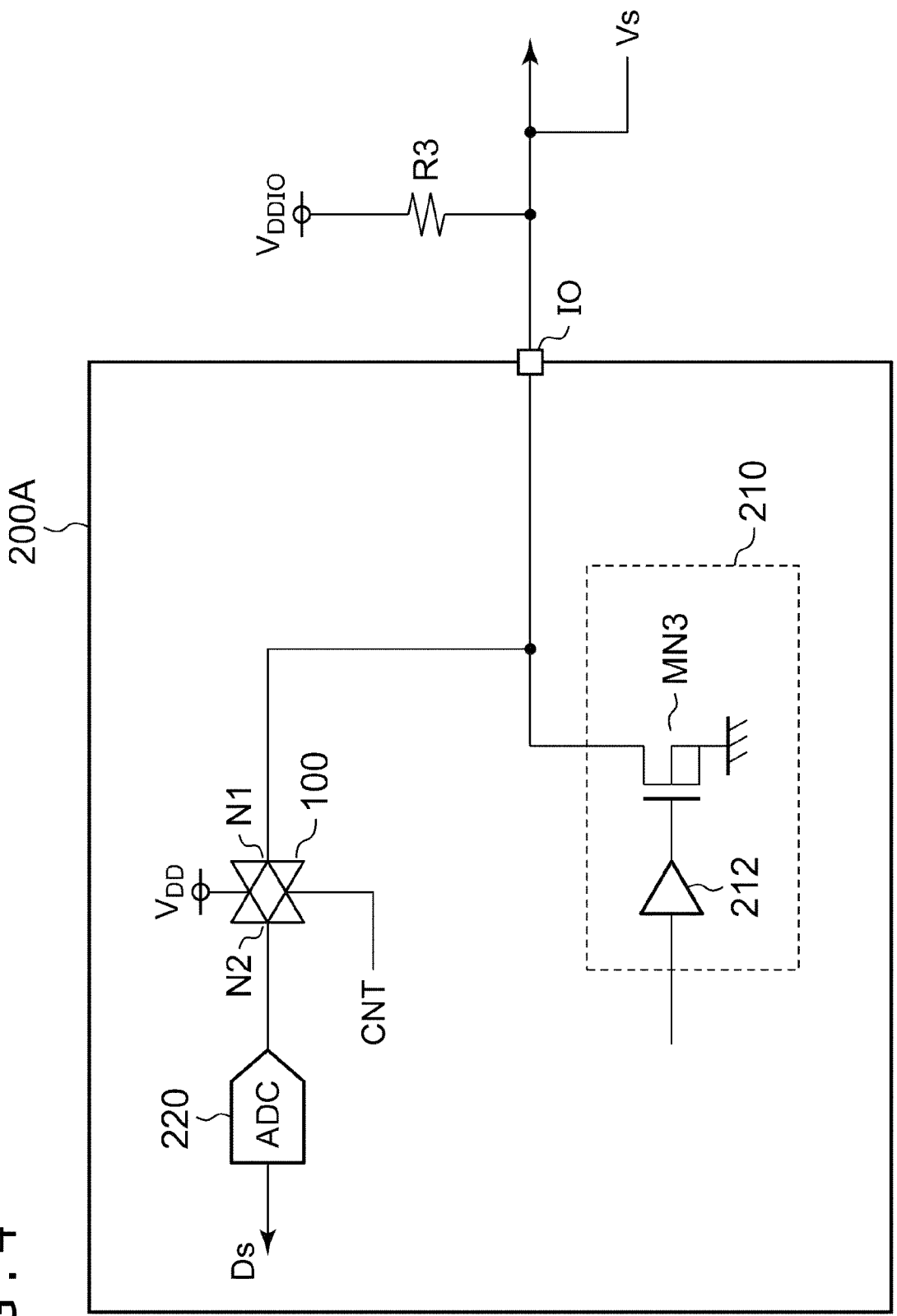
FIG. 4 is a block diagram of a semiconductor device including the analog switch circuit.

FIG. 4 is a block diagram of a semiconductor device 200A including the analog switch circuit 100. The semiconductor device 200A includes an input/output (IO) pin, an open drain circuit 210, and an A/D converter 220 in addition to the analog switch circuit 100.

The IO pin serves as an output pin for the semiconductor device 200A to output a binary signal to the outside and an input pin for the semiconductor device 200A to acquire an analog signal Vs from the outside.

The open drain circuit 210 outputs a binary signal such as an error signal and an interrupt signal to an external circuit through the IO pin. The open drain circuit 210 includes an NMOS transistor MN3 and a driver 212. The IO pin is pulled up to a power line $V_{DDIO}$ through an external resistor R3.

The analog switch circuit 100 is provided between the IO pin of the semiconductor device 200A and an input of the A/D converter 220.

When the control signal CNT becomes high, the analog signal Vs input from the outside to the IO pin is input to the A/D converter 220 through the analog switch circuit 100. The A/D converter 220 outputs a digital signal Ds corresponding to the analog signal Vs.

FIG. 5 is a block diagram of a semiconductor device 200B including the analog switch circuit 100. The semiconductor device 200B includes an IO pin, an input buffer 230, and the A/D converter 220 in addition to the analog switch circuit 100.

The IO pin serves as an input pin for the semiconductor device 200B to receive a binary signal from the outside and an input pin for the semiconductor device 200B to acquire the analog signal Vs from the outside.

An input of the input buffer 230 is connected to the IO pin, and the input receives a digital signal output from an external transmission buffer 300. The high level of the digital signal is an external power supply voltage $V_{DDIO}$.

The analog switch circuit 100 is provided between the IO pin of the semiconductor device 200B and the input of the A/D converter 220.

When the control signal CNT becomes high, the analog signal Vs input from the outside to the IO pin is input to the A/D converter 220 through the analog switch circuit 100. The A/D converter 220 outputs the digital signal Ds corresponding to the analog signal Vs.

Although specific terms are used to describe the embodiments of the present disclosure, the description is just illustrated to help the understanding, and the description does not limit the present disclosure or the claims. The scope of the present technology is defined by the claims, and therefore, embodiments, examples, and modifications not described here are also included in the scope of the present technology.

Supplement

The following technique is disclosed in the present specification.

Item 1

An analog switch circuit that is able to electrically connect and disconnect an input node and an output node according to a control signal, the analog switch circuit including:

an intermediate node;

a first PMOS transistor including a source connected to the input node and a back gate and a drain that are connected to the intermediate node;

a second PMOS transistor including a source connected to the output node, a back gate and a drain that are connected to the intermediate node, and a gate connected to a gate of the first PMOS transistor;

a first NMOS transistor including a source grounded and a drain connected to the gates of the first PMOS transistor and the second PMOS transistor;

a third PMOS transistor connected between the intermediate node and the drain of the first NMOS transistor, the third PMOS transistor including a gate connected to a gate of the first NMOS transistor;

a first resistor connected between the gate of the first NMOS transistor and a ground; and a driver including an input that receives the control signal and an output connected to the gate of the first NMOS transistor.

Item 2

The analog switch circuit according to Item 1, further including:

a second resistor connected between the intermediate node and the drain of the first NMOS transistor, in series with the third PMOS transistor.

Item 3

The analog switch circuit according to Item 1 or 2, further including:

a second NMOS transistor connected between the input node and the output node, in parallel to a series connection circuit of the first PMOS transistor and the second PMOS transistor, the second NMOS transistor including a back gate grounded and a gate connected to the output of the driver.

Item 4

The analog switch circuit according to any one of Items 1 to 3, in which the analog switch circuit is integrated into one semiconductor substrate.

Item 5

A semiconductor device including:

an input/output pin; and the analog switch circuit according to any one of Items 1 to 4 including an input node connected to the input/output pin.

Item 6

The semiconductor device according to Item 5, further including:

an A/D converter connected to an output node of the analog switch circuit.

Item 7

The semiconductor device according to Item 5 or 6, further including:

an open drain circuit connected to the input/output pin.

Item 8

The semiconductor device according to Item 5 or 6, further including:

an input buffer that receives a digital signal input from outside to the input/output pin.

According to an example of the present disclosure, the reverse current can be prevented.

What is claimed is:

1. An analog switch circuit that is able to electrically connect and disconnect an input node and an output node according to a control signal, the analog switch circuit comprising:

an intermediate node;

a first P-channel metal oxide semiconductor transistor including a source connected to the input node and a back gate and a drain that are connected to the intermediate node;

a second P-channel metal oxide semiconductor transistor including a source connected to the output node, a back gate and a drain that are connected to the intermediate node, and a gate connected to a gate of the first P-channel metal oxide semiconductor transistor;

a first N-channel metal oxide semiconductor transistor including a source grounded and a drain connected to the gates of the first P-channel metal oxide semiconductor transistor and the second P-channel metal oxide semiconductor transistor;

a third P-channel metal oxide semiconductor transistor connected between the intermediate node and the drain of the first N-channel metal oxide semiconductor transistor, the third P-channel metal oxide semiconductor transistor including a gate connected to a gate of the first N-channel metal oxide semiconductor transistor;

a first resistor connected between the gate of the first N-channel metal oxide semiconductor transistor and a ground; and a driver including an input that receives the control signal and an output connected to the gate of the first N-channel metal oxide semiconductor transistor.

2. The analog switch circuit according to claim 1, further comprising:

a second resistor connected between the intermediate node and the drain of the first N-channel metal oxide semiconductor transistor, in series with the third P-channel metal oxide semiconductor transistor.

3. The analog switch circuit according to claim 1, further comprising:

a second N-channel metal oxide semiconductor transistor connected between the input node and the output node, in parallel to a series connection circuit of the first P-channel metal oxide semiconductor transistor and the second P-channel metal oxide semiconductor transistor, the second N-channel metal oxide semiconductor transistor including a back gate grounded and a gate connected to the output of the driver.

4. The analog switch circuit according to claim 1, wherein the analog switch circuit is integrated into one semiconductor substrate.

5. A semiconductor device comprising:

an input/output pin; and the analog switch circuit according to claim 1 including an input node connected to the input/output pin.

6. The semiconductor device according to claim 5, further comprising:

an analog-to-digital converter connected to an output node of the analog switch circuit.

7. The semiconductor device according to claim 5, further comprising:

an open drain circuit connected to the input/output pin.

8. The semiconductor device according to claim 5, further comprising:
   an input buffer that receives a digital signal input from outside to the input/output pin.

* * * * *